United States Patent
Ye et al.

(10) Patent No.: US 7,776,698 B2
(45) Date of Patent: Aug. 17, 2010

(54) SELECTIVE FORMATION OF SILICON CARBON EPITAXIAL LAYER

(75) Inventors: Zhiyuan Ye, Cupertino, CA (US);
Saurabh Chopra, Sunnyvale, CA (US);
Andrew Lam, San Francisco, CA (US);
Yihwan Kim, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/867,933

(22) Filed: Oct. 5, 2007

(65) Prior Publication Data

US 2009/0093094 A1    Apr. 9, 2009

(51) Int. Cl.
*H01L 21/336* (2006.01)
*H01L 21/8238* (2006.01)
*H01L 21/36* (2006.01)
*H01L 21/311* (2006.01)

(52) U.S. Cl. .................. 438/285; 438/222; 438/226; 438/478; 438/695; 257/E21.09; 257/E21.092; 257/E21.132

(58) Field of Classification Search .................. 438/197, 438/700–703; 257/E21.09, E21.092, E21.132
See application file for complete search history.

(56) References Cited

U.S. PATENT DOCUMENTS

| 5,108,792 | A | 4/1992 | Anderson et al. |
|---|---|---|---|
| 5,179,677 | A | 1/1993 | Anderson et al. |
| 5,186,718 | A | 2/1993 | Tepman et al. |
| 6,803,297 | B2 | 10/2004 | Jennings et al. |
| 6,821,825 | B2 | 11/2004 | Todd et al. |
| 6,897,131 | B2 | 5/2005 | Ramachandran et al. |
| 6,916,398 | B2 | 7/2005 | Chen et al. |
| 6,998,153 | B2 | 2/2006 | Chiang et al. |
| 7,132,338 | B2 | 11/2006 | Samoilov et al. |
| 7,361,222 | B2 * | 4/2008 | Janzen et al. ............... 117/103 |
| 2004/0224089 | A1 | 11/2004 | Singh et al. |
| 2005/0079691 | A1 | 4/2005 | Kim et al. |
| 2006/0115933 | A1 | 6/2006 | Ye et al. |
| 2006/0115934 | A1 | 6/2006 | Kim et al. |
| 2006/0166414 | A1 * | 7/2006 | Carlson et al. .............. 438/149 |
| 2006/0216876 | A1 | 9/2006 | Kim et al. |
| 2006/0234488 | A1 | 10/2006 | Kim et al. |
| 2006/0240630 | A1 | 10/2006 | Bauer et al. |
| 2007/0015333 | A1 * | 1/2007 | Kishimoto et al. .......... 438/259 |
| 2007/0161216 | A1 * | 7/2007 | Bauer .......................... 438/503 |
| 2007/0287272 | A1 * | 12/2007 | Bauer et al. ................. 438/485 |
| 2008/0182397 | A1 * | 7/2008 | Lam et al. ................... 438/607 |

OTHER PUBLICATIONS

Bauer, M., "Tensile Strained Selective Silicon Carbon Alloys for Recessed Source Drain Areas of Devices", *Abstract 210th ECS Meeting* Oct. 29 through Nov. 3, 2006.

* cited by examiner

*Primary Examiner*—Hsien-ming Lee
*Assistant Examiner*—Kevin Parendo
(74) *Attorney, Agent, or Firm*—Diehl Servilla LLC

(57) ABSTRACT

Methods for formation of epitaxial layers containing n-doped silicon are disclosed, including methods for the formation and treatment of epitaxial layers in semiconductor devices, for example, Metal Oxide Semiconductor Field Effect Transistor (MOSFET) devices. Formation of the n-doped epitaxial layer involves exposing a substrate in a process chamber to deposition gases including a silicon source, a carbon source and an n-dopant source at a first temperature and pressure and then exposing the substrate to an etchant at a second higher temperature and a higher pressure than during deposition.

19 Claims, 1 Drawing Sheet

SELECTIVE FORMATION OF SILICON CARBON EPITAXIAL LAYER

BACKGROUND

Embodiments of the present invention generally relate to methods and apparatus for selective formation of epitaxial layers containing silicon and carbon. Specific embodiments pertain to methods and apparatus for the selective formation of n-doped epitaxial layers in semiconductor devices, for example, Metal Oxide Semiconductor Field Effect Transistor (MOSFET) devices.

The amount of current that flows through the channel of a MOS transistor is directly proportional to a mobility of carriers in the channel, and the use of high mobility MOS transistors enables more current to flow and consequently faster circuit performance. Mobility of the carriers in the channel of an MOS transistor can be increased by producing a mechanical stress in the channel. A channel under compressive strain, for example, a silicon-germanium channel layer grown on silicon, has significantly enhanced hole mobility to provide a pMOS transistor. A channel under tensile strain, for example, a thin silicon channel layer grown on relaxed silicon-germanium, achieves significantly enhanced electron mobility to provide an nMOS transistor.

An nMOS transistor channel under tensile strain can also be provided by forming one or more carbon-doped silicon epitaxial layers, which may be complementary to the compressively strained SiGe channel in a pMOS transistor. Thus, carbon-doped silicon and silicon-germanium epitaxial layers can be deposited on the source/drain of nMOS and pMOS transistors, respectively. The source and drain areas can be either flat or recessed by selective Si dry etching. When properly fabricated, nMOS sources and drains covered with carbon-doped silicon epitaxy imposes tensile stress in the channel and increases nMOS drive current.

To achieve enhanced electron mobility in the channel of nMOS transistors having a recessed source/drain using carbon-doped silicon epitaxy, it is desirable to selectively form the carbon-doped silicon epitaxial layer on the source/drain either through selective deposition or by post-deposition processing. Furthermore, it is desirable for the carbon-doped silicon epitaxial layer to contain substitutional C atoms to induce tensile strain in the channel. Higher channel tensile strain can be achieved with increased substitutional C content in a carbon-doped silicon source and drain.

Generally, sub-100 nm CMOS (complementary metal-oxide semiconductor) devices require a junction depth to be less than 30 nm. Selective epitaxial deposition is often utilized to form epitaxial layers ("epilayers") of silicon-containing materials (e.g., Si, SiGe and Si:C) into the junctions. Selective epitaxial deposition permits growth of epilayers on silicon moats with no epitaxial growth on dielectric areas. Selective epitaxy can be used within semiconductor devices, such as elevated source/drains, source/drain extensions, contact plugs or base layer deposition of bipolar devices.

A typical selective epitaxy process involves a deposition reaction and an etch reaction. During the deposition process, the epitaxial layer is formed on a monocrystalline surface while a layer of polycrystalline and/or amorphous material is deposited on at least a second layer, such as an existing polycrystalline layer and/or an amorphous layer. The deposition and etch reactions occur simultaneously with relatively different reaction rates to an epitaxial layer and to a polycrystalline layer. However, the deposited polycrystalline/amorphous layer is generally etched at a faster rate than the epitaxial layer. Therefore, by changing the concentration of an etchant gas, the net selective process results in deposition of epitaxy material and limited, or no, deposition of polycrystalline material. For example, a selective epitaxy process may result in the formation of an epilayer of silicon-containing material on a monocrystalline silicon surface while no deposition is left on the spacer.

Selective epitaxy deposition of silicon-containing materials has become a useful technique during formation of elevated source/drain and source/drain extension features, for example, during the formation of silicon-containing MOSFET (metal oxide semiconductor field effect transistor) devices. Source/drain extension features are manufactured by etching a silicon surface to make a recessed source/drain feature and subsequently filling the etched surface with a selectively grown epilayers, such as a silicon germanium (SiGe) material. Selective epitaxy permits near complete dopant activation with in-situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. In order to compensate for junction consumption, an elevated source/drain is epitaxially and selectively grown on the junction. Typically, the elevated source/drain layer is undoped silicon.

However, current selective epitaxy processes have some drawbacks. In order to maintain selectivity during present epitaxy processes, chemical concentrations of the precursors, as well as reaction temperatures, must be regulated and adjusted throughout the deposition process. If not enough silicon precursor is administered, then the etching reaction may dominate and the overall process is slowed down. Also, harmful over-etching of substrate features may occur. If insufficient etchant precursor is administered, then the deposition reaction may dominate, reducing the selectivity to form monocrystalline and polycrystalline materials across the substrate surface. Also, current selective epitaxy processes usually require a high reaction temperature, such as about 800° C., 1,000° C. or higher. Such high temperatures are not desirable during a fabrication process due to thermal budget considerations and possible uncontrolled nitridation reactions to the substrate surface. In addition, most of the C atoms incorporated through typical selective Si:C epitaxy processes at the higher process temperatures occupy non-substitutional (i.e. interstitial) sites of the Si lattice. By lowering growth temperature, a higher fraction of substitutional carbon level can be achieved (e.g. nearly 100% at growth temperature of 550° C.), however, the slow growth rate at these lower temperatures is undesirable for device applications, and such selective processing might not be possible at the lower temperatures.

The manufacturing conditions for silicon carbon epitaxy may be different for epitaxy having different dopants and dopant concentrations. The incorporation of high levels of dopants (e.g. greater than $10^{20}$ atoms/cm$^3$) into the Si:C epitaxy during deposition is of interest, because the incorporation of high levels of dopants during deposition reduces the need to increase the dopant level using subsequent procedures such as ion implantation. Taking into consideration the wide array of variables in an epitaxial manufacturing process including, but not limited to, temperature, carrier gas type, deposition gas type, etching gas type, flow rates for each of the etching, deposition and carrier gases and chamber pressure, the selection and optimization of specific variables for a particular epitaxy having a specific dopant and dopant concentration can be unpredictable. Thus, the incorporation of high levels of dopants into the Si:C epitaxy may require changing a large number of variables to achieve high quality epitaxy. It would be desirable to provide process for forming heavily n-doped Si:C epitaxy. Such methods would be useful in the manufacture of transistor devices.

SUMMARY

One embodiment of the present invention relates to methods of forming and processing epitaxial layers containing silicon. Other embodiments relate to methods manufacturing of fabricating transistor devices including epitaxial layers containing silicon and carbon.

In accordance with one embodiment of the present invention, a method for epitaxially forming a silicon-carbon film on a substrate surface, comprises placing a substrate including a monocrystalline surface and secondary surfaces into a process chamber; exposing the substrate to deposition gases comprising a silicon source, a carbon source and an n-type dopant at a temperature of less than about 600° C. and a deposition pressure; and exposing the substrate to an etching gas comprising hydrogen chloride at a temperature exceeding about 600° C. and at a pressure at least about 10 times the pressure during exposure to the deposition gas, the method resulting in selective deposition of heavily doped n-type epitaxy on the monocrystalline surface.

In one embodiment, the dopant comprises a phosphorus source, for example, phosphine. In other embodiments, the dopant comprises an arsenic source, for example arsine. The dopant may comprise a combination of arsine and phosphine. In one embodiment, the etching gas comprises only hydrogen chloride. The hydrogen chloride may be delivered to the chamber from a hydrogen chloride source gas. Alternatively, the hydrogen chloride may be formed in the chamber upon mixing hydrogen and chlorine source gases in the chamber.

In one embodiment, the dopant level is at least about 2× than $10^{20}$ atoms/cm$^3$. According to one embodiment, the temperature during deposition is in the range of about 575° C. and below about 600° C. In one embodiment, the temperature during etching is in the range of above about 600° C. and below about 650° C.

Another embodiment includes flowing dichlorosilane during deposition. In another embodiment, hydrogen chloride is flowed during deposition. In an embodiment of the invention, the epitaxial film is formed during a fabrication step of a transistor manufacturing process, and the method further comprises: forming a gate dielectric on a substrate; forming a gate electrode on the gate dielectric; and forming source/drain regions on the substrate on opposite sides of the electrode and defining a channel region between the source/drain regions.

The foregoing has outlined rather broadly certain features and technical advantages of the present invention. It should be appreciated by those skilled in the art that the specific embodiments disclosed may be readily utilized as a basis for modifying or designing other structures or processes within the scope of the present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
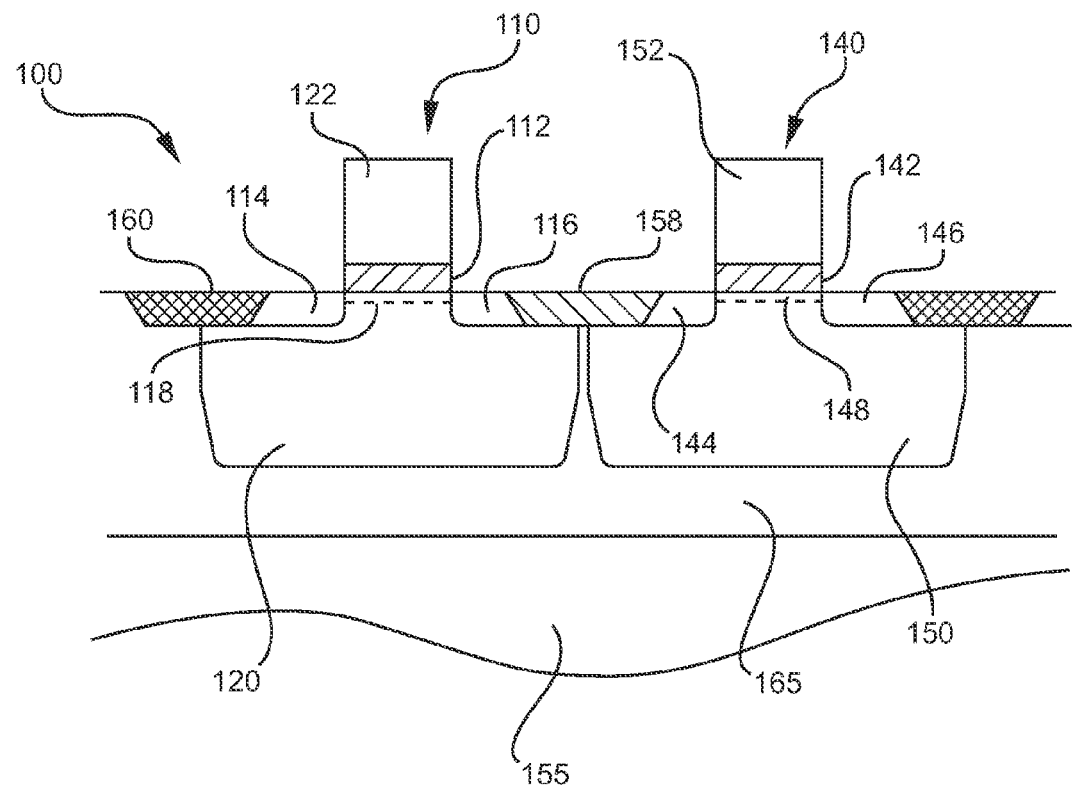
FIG. 1 is a cross-sectional view of a field effect transistor pair in accordance with an embodiment of the invention.

Embodiments of the invention generally provide methods and apparatus for forming and treating a silicon-containing epitaxial layer. Specific embodiments pertain to methods and apparatus for forming and treating an epitaxial layer during the manufacture of a transistor.

As used herein, epitaxial deposition refers to the deposition of a single crystal layer on a substrate, so that the crystal structure of the deposited layer matches the crystal structure of the substrate. Thus, an epitaxial layer or film is a single crystal layer or film having a crystal structure that matches the crystal structure of the substrate. Epitaxial layers are distinguished from bulk substrates and polysilicon layers.

Throughout the application, the terms "silicon-containing" materials, compounds, films or layers should be construed to include a composition containing at least silicon and may contain germanium, carbon, boron, arsenic, phosphorus gallium and/or aluminum. Other elements, such as metals, halogens or hydrogen may be incorporated within a silicon-containing material, compound, film or layer, usually in part per million (ppm) concentrations. Compounds or alloys of silicon-containing materials may be represented by an abbreviation, such as Si for silicon, SiGe for silicon germanium, Si:C for silicon carbon and SiGeC for silicon germanium carbon. The abbreviations do not represent chemical equations with stoichiometrical relationships, nor represent any particular reduction/oxidation state of the silicon-containing materials.

One or more embodiments of the invention generally provide processes to selectively and epitaxially deposit silicon-containing materials on monocrystalline surfaces of a substrate during fabrication of electronic devices. A substrate containing a monocrystalline surface (e.g., silicon or silicon germanium) and at least a secondary surface, such as an amorphous surface and/or a polycrystalline surface (e.g., oxide or nitride), is exposed to an epitaxial process to form an epitaxial layer on the monocrystalline surface while forming limited or no polycrystalline layer on the secondary surfaces. The epitaxial process typically includes repeating a cycle of a deposition process and an etching process until the desired thickness of an epitaxial layer is grown. Exemplary alternating deposition and etch processes are disclosed in commonly assigned and copending U.S. patent application Ser. No. 11/001,774, published as United States Patent Application Publication No. 2006/0115934, entitled, Selective Epitaxy Process With Alternating Gas Supply, the entire content of which is incorporated herein by reference.

In one or more embodiments, the deposition process includes exposing the substrate surface to a deposition gas containing at least a silicon source and a carrier gas. The deposition gas may also include a germanium source and/or carbon source, as well as a dopant source. In particular embodiments, the deposition gas contains a sufficient amount of an n-type dopant precursor that results in the in the epitaxial film containing at least about $1\times10^{20}$ atoms/cm$^3$ of an n-type dopant. In specific embodiments, the final epitaxial film contains at least about $2\times10^{20}$ atoms/cm$^3$ of an n-type dopant, and more specifically, at least about $5 \times 10^{20}$ atoms/$cm^3$ of an n-type dopant. As used herein, these levels of dopant concentration will be referred to as heavily doped with an n-type dopant. Examples of suitable n-type dopants include P, As and Sb. During the deposition process, an epitaxial layer is formed on the monocrystalline surface of the substrate, while a polycrystalline/amorphous layer is formed on secondary surfaces, such as dielectric, amorphous and/or polycrystalline surfaces, which will be collectively referred to as "secondary surfaces". Subsequently, the substrate is exposed to an etching gas. Typically, the etching gas includes a carrier gas and an etchant, such as chlorine gas or hydrogen chloride. However, according to one or more embodiments, applicants determined that effective etching of heavily doped n-type films can be etched only with hydrogen chloride, and not with chlorine gas. The etching gas removes silicon-containing materials deposited during the deposition process. During the etching process, the polycrystalline/amorphous layer is removed at a faster rate than the epitaxial layer. Therefore, the net result of the deposition and etching processes forms epitaxially grown silicon-containing material on monocrystalline surfaces while minimizing growth, if any, of polycrystalline/amorphous silicon-containing material on the secondary surfaces. A cycle of the deposition and etching processes may be repeated as needed to obtain the desired thickness of silicon-containing materials. The silicon-containing materials which can be deposited by embodiments of the invention include silicon, silicon germanium, silicon carbon, silicon germanium carbon, and variants thereof, including dopants.

In one example of the process, use of HCl gas as an etchant results in sufficient removal of the polycrystalline/amorphous silicon-containing material on the secondary surfaces for heavily n-doped epitaxy. In general, deposition processes may be conducted at lower temperatures than etching reactions, since etchants often need a high temperature to be activated. According to one or more embodiments, it has been determined that by ramping the pressure after deposition by at least about 10 times the deposition pressure, and in specific embodiments, more than about 20 times the deposition pressure, and in more specific embodiments more than about 30 times the deposition pressure, effective etching can occur at temperatures above about 600° C. and below about 650° C. for heavily doped n-type epitaxy.

Nitrogen is typically a preferred carrier gas due to cost considerations associated with the use of argon and helium as a carrier gas. Despite the fact that nitrogen is generally much less expensive than argon, according to one or more embodiments of the invention, argon is a preferred carrier gas, particularly in embodiments in which methylsilane is a silicon source gas. One drawback that may occur from using nitrogen as a carrier gas is the nitridizing of materials on a substrate during deposition processes. However, high temperature, such as over 800° C., is required to activate nitrogen in such a manner. Therefore, according to one or more embodiments, nitrogen can be used as an inert carrier gas in processes conducted at temperatures below the nitrogen activation threshold. The use of an inert carrier gas has several attributes during a deposition process. For one, an inert carrier gas may increase the deposition rate of the silicon-containing material. While hydrogen may be used as a carrier gas, during the deposition process, hydrogen has a tendency to adsorb or react to the substrate to form hydrogen-terminated surfaces. A hydrogen-terminated surface reacts much slower to epitaxial growth than a bare silicon surface. Therefore, the use of an inert carrier gas increases the deposition rate by not adversely effecting the deposition reaction.

According to a first embodiment of the invention, blanket or nonselective epitaxy with alternating steps of deposition and purge results in improved crystallinity of epitaxial films grown using a higher order silane compared to continuous deposition. As used herein, "higher order silane" refers to a disilane or higher silane precursor. In certain specific embodiments, "higher order silane" refers to disilane, neopentasilane (NPS), or a mixture of these. An exemplary process includes loading a substrate into a process chamber and adjusting the conditions within the process chamber to a desired temperature and pressure. Then, a deposition process is initiated to form an epitaxial layer on a monocrystalline surface of the substrate. The deposition process is then terminated. The thickness of the epitaxial layer is then determined. If the predetermined thickness of the epitaxial layer is achieved, then the epitaxial process is terminated. However, if the predetermined thickness is not achieved, then steps of deposition and purge are repeated as a cycle until the predetermined thickness is achieved. Further details of this exemplary process are described below.

The substrates may be unpatterned or patterned. Patterned substrates are substrates that include electronic features formed into or onto the substrate surface. The patterned substrate usually contains monocrystalline surfaces and at least one secondary surface that is non-monocrystalline, such as a dielectric, polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as oxides or nitrides, specifically silicon oxide or silicon nitride, as well as amorphous silicon surfaces.

After loading a substrate into the process chamber, the conditions in the process chamber are adjusted to a predetermined temperature and pressure. The temperature is tailored to the particular conducted process. Generally, the process chamber is maintained at a temperature below about 600° C. during deposition and above about 600° C. during etching. The appropriate temperature to conduct epitaxial process may depend on the particular precursors used to deposit the silicon-containing. In one example, it has been found that hydrogen chloride (HCl) gas works well as an etchant for heavily n-doped silicon-containing materials, particularly when the pressure has been increased at least about 10 times the pressure used during deposition.

The process chamber is usually maintained at a pressure from about 0.1 Torr to 50 Torr during deposition. In one embodiment, the deposition pressure is maintained at about 10 Torr. The pressure may fluctuate during and between process steps, but is generally maintained constant. During etching, the pressure in the chamber is ramped up to at least about 10 times the pressure used during deposition.

During the deposition process the substrate is exposed to a deposition gas to form an epitaxial layer. The substrate is exposed to the deposition gas for a period of time of about 0.5 seconds to about 30 seconds, for example, from about 1 second to about 20 seconds, and more specifically from about 5 seconds to about 10 seconds. In a specific embodiment, the deposition step lasts for about 10 to 11 seconds. The specific exposure time of the deposition process is determined in relation to the exposure time during a subsequent etching process, as well as particular precursors and temperature used in the process. Generally, the substrate is exposed to the deposition gas long enough to form a maximized thickness of an epitaxial layer In one or more embodiments, the deposition gas contains at least a silicon source and a carrier gas, and may contain at least one secondary elemental source, such as a carbon source and/or a germanium source. Also, the deposition gas may further include a dopant compound to provide a source of a dopant, such as boron, arsenic, phosphorus, gallium and/or aluminum. In an alternative embodiment, the deposition gas may include at least one etchant, such as hydrogen chloride. The hydrogen chloride may be delivered as hydrogen chloride gas or as separate hydrogen and chlorine gases that are reacted in the chamber to form HCl.

The silicon source is usually provided into the process chamber at a rate in a range from about 5 sccm to about 500 sccm, preferably from about 10 sccm to about 300 sccm, and more preferably from about 50 sccm to about 200 sccm, for example, about 100 sccm. In a specific embodiment, silane is flowed at about 60 sccm. Silicon sources useful in the deposition gas to deposit silicon-containing compounds include silanes, halogenated silanes and organosilanes. Silanes include silane ($SiH_4$) and higher silanes with the empirical formula $Si_xH_{(2x+2)}$, such as disilane ($Si_2H_6$), trisilane ($Si_3H_8$), tetrasilane ($Si_4H_{10}$), and neopentasilane, as well as others. Halogenated silanes include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Organosilane compounds have been found to be advantageous silicon sources as well as carbon sources in embodiments which incorporate carbon in the deposited silicon-containing compound. According to one or more embodiments, methylsilane in an argon-containing carrier gas is a preferred silicon-containing source and carrier gas combination.

The silicon source is usually provided into the process chamber along with a carrier gas. The carrier gas has a flow rate from about 1 slm (standard liters per minute) to about 100 slm, for example, from about 5 slm to about 75 slm, and more specifically from about 10 slm to about 50 slm, for example, about 10 slm. Carrier gases may include nitrogen ($N_2$), hydrogen ($H_2$), argon, helium and combinations thereof. An inert carrier gas is preferred and includes nitrogen, argon, helium and combinations thereof. A carrier gas may be selected based on the precursor(s) used and/or the process temperature during the epitaxial process. Usually the carrier gas is the same throughout for each of the deposition and etching steps. However, some embodiments may use different carrier gases in particular steps.

Typically, nitrogen is utilized as a carrier gas in embodiments featuring low temperature (e.g., <800° C.) processes. Low temperature processes are accessible due in part to the use of chlorine gas in the etching process. Nitrogen remains inert during low temperature deposition processes. Therefore, nitrogen is not incorporated into the deposited silicon-containing material during low temperature processes. Also, a nitrogen carrier gas does not form hydrogen-terminated surfaces as does a hydrogen carrier gas. The hydrogen-terminated surfaces formed by the adsorption of hydrogen carrier gas on the substrate surface inhibit the growth rate of silicon-containing layers. Finally, the low temperature processes may take economic advantage of nitrogen as a carrier gas, since nitrogen is far less expensive than hydrogen, argon or helium. Despite the economic advantages, according to certain embodiments, argon is a preferred carrier gas.

The deposition gas used also contains at least one secondary elemental source, such as a carbon source and/or a germanium source. A carbon source may be added during deposition to the process chamber with the silicon source and carrier gas to form a silicon-containing compound, such as a silicon carbon material. A carbon source is usually provided into the process chamber at a rate in the range from about 0.1 sccm to about 40 sccm, for example, from about 3 sccm to about 25 sccm, and more specifically, from about 5 sccm to about 25 sccm, for example, about 10 sccm. The carbon source may be 5% diluted in argon or nitrogen gas and flowed at a rate of 750 sccm. Carbon sources useful to deposit silicon-containing compounds include organosilanes, alkyls, alkenes and alkynes of ethyl, propyl and butyl. Such carbon sources include methylsilane ($CH_3SiH_3$), dimethylsilane (($CH_3$)$_2SiH_2$), ethylsilane ($CH_3CH_2SiH_3$), methane ($CH_4$), ethylene ($C_2H4$), ethyne ($C_2H_2$), propane ($C_3H_8$), propene ($C_3H_6$), butyne ($C_4H_6$), as well as others. The carbon concentration of an epitaxial layer is in the range from about 200 ppm to about 5 atomic %, preferably from about 1 atomic % to about 3 atomic %, for example 1.5 atomic %. In one embodiment, the carbon concentration may be graded within an epitaxial layer, preferably graded with a lower carbon concentration in the initial portion of the epitaxial layer than in the final portion of the epitaxial layer. Alternatively, a germanium source and a carbon source may both be added during deposition into the process chamber with the silicon source and carrier gas to form a silicon-containing compound, such as a silicon carbon or silicon germanium carbon material.

Alternatively, a germanium source may be added to the process chamber with the silicon source and carrier gas to form a silicon-containing compound, such as a silicon germanium material. The germanium source is usually provided into the process chamber at a rate in the range from about 0.1 sccm to about 20 sccm, preferably from about 0.5 sccm to about 10 sccm, and more preferably from about 1 sccm to about 5 sccm, for example, about 2 sccm. Germanium sources useful to deposit silicon-containing compounds include germane ($GeH_4$), higher germanes and organogermanes. Higher germanes include compounds with the empirical formula $Ge_xH_{(2x+2)}$, such as digermane ($Ge_2H_6$), trigermane ($Ge_3H_8$) and tetragermane ($Ge_4H_{10}$), as well as others. Organogermanes include compounds such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$). Germanes and organogermane compounds have been found to be advantageous germanium sources and carbon sources in embodiments while incorporating germanium and carbon into the deposited silicon-containing compounds, namely SiGe and SiGeC compounds. The germanium concentration in the epitaxial layer is in the range from about 1 atomic % to about 30 atomic %, for example, about 20 atomic %. The germanium concentration may be graded within an epitaxial layer, preferably graded with a higher germanium concentration in the lower portion of the epitaxial layer than in the upper portion of the epitaxial layer.

The deposition gas used during deposition may further include at least one dopant compound to provide a source of elemental dopant, such as boron, arsenic, phosphorus, gallium or aluminum. Dopants provide the deposited silicon-containing compounds with various conductive characteristics, such as directional electron flow in a controlled and desired pathway required by the electronic device. Films of the silicon-containing compounds are doped with particular dopants to achieve the desired conductive characteristic. In one example, the silicon-containing compound is doped n-type, such as with phosphorus, antimony and/or arsenic to a concentration in the range from about $10^{20}$ atoms/cm$^3$ to about $10^{21}$ atoms/cm$^3$. In specific embodiments, the dopant level exceeds about $2 \times 10^{20}$ atoms/cm$^3$.

A dopant source is usually provided into the process chamber during deposition at a rate in the range from about 0.1 sccm to about 20 sccm, for example, from about 0.5 sccm to about 10 sccm, and more specifically from about 1 sccm to about 5 sccm, for example, about 3 sccm. Dopants may also include arsine (AsH$_3$), phosphine (PH$_3$) and alkylphosphines, such as with the empirical formula R$_x$PH$_{(3-x)}$, where R=methyl, ethyl, propyl or butyl and x=1, 2 or 3. Alkylphosphines include trimethylphosphine ((CH$_3$).sub.3P), dimethylphosphine ((CH$_3$)$_2$PH), triethylphosphine ((CH$_3$CH$_2$).sub.3P) and diethylphosphine ((CH$_3$CH$_2$)$_2$PH). Aluminum and gallium dopant sources may include alkylated and/or halogenated derivates, such as described with the empirical formula R$_x$MX$_{(3-x)}$, where M=Al or Ga, R=methyl, ethyl, propyl or butyl, X=Cl or F and x=0, 1, 2 or 3. Examples of aluminum and gallium dopant sources include trimethylaluminum (Me$_3$Al), triethylaluminum (Et$_3$Al), dimethylaluminumchloride (Me$_2$AlCl), aluminum chloride (AlCl$_3$), trimethylgallium (Me$_3$Ga), triethylgallium (Et$_3$Ga), dimethylgalliumchloride (Me$_2$GaCl) and gallium chloride (GaCl$_3$).

According to one or more embodiments, after the deposition process is terminated, the process chamber may be flushed with a purge gas or the carrier gas and/or the process chamber may be evacuated with a vacuum pump. The purging and/or evacuating processes remove excess deposition gas, reaction by-products and other contaminants. In an exemplary embodiment, the process chamber may be purged for about 10 seconds by flowing a carrier gas at about 5 slm. A cycle of deposition and purge may be repeated for numerous cycles. In one embodiment, the deposition and purge cycle is repeated about 90 times.

In another aspect of the present invention, a blanket or non-selective deposition is performed at low temperatures, for example, below about 600° C. and lower, using a higher order silane (e.g. disilane and higher) source. This assists in amorphous growth (rather than polycrystalline) on dielectric surfaces such as oxide and nitride during the deposition step (nonselective deposition), which facilitates removal of the layer on dielectric surfaces by a subsequent etch step and minimizes damage on single crystalline layer grown on the crystalline substrate.

The use of neopentasilane in the formation of epitaxial films on substrates is described in commonly assigned U.S. application Ser. No. 10/688,797, published as United States Patent Application Publication No. 2004/0224089, entitled Silicon-Containing Layer Deposition with Silicon Compounds, the entire content of which is incorporated herein by reference. Neopentasilane, ((SiH$_3$)$_4$Si), is a tertiary silane containing four silyl (—SiH$_3$) groups bonded to a silicon atom. The use of higher order silanes enables higher deposition rate at lower temperature and for silicon-containing films incorporating carbon, higher incorporation of substitutional carbon atoms than the use of mono-silane as a silicon source gas. In blanket deposition experiments conducted comparing silane as silicon a silicon source gases at a process temperature of 600° C. and using nitrogen as a carrier gas and methylsilane (1% diluted in hydrogen) as a silicon-carbon source, 50% of the carbon was substitutional carbon in the deposited films. However, with the higher order silanes, disilane produced films having greater than about 90% substitutional carbon and neopentasilane produced films having nearly 100% substitutional carbon.

In one or more embodiments, a liquid source cabinet that includes a neopentasilane ampoule installed in close proximity to the process chamber, for example, within less than about five feet, more specifically less than about two or three feet of the process chamber, enables higher delivery rate of the silicon source and consequently higher deposition rate.

Thus, embodiments of the present invention provide selective epitaxy processes for silicon-containing films, for example, Si:C films with high substitutional carbon concentration (>1%), which can be used for forming tensile strained channel of N-type MOSFET structure when epitaxial films are grown on recessed source/drain of a transistor. In general, it is difficult to achieve both of high substitutional carbon concentration (>1%) in Si:C epitaxy and selective growth with smooth morphology due to low temperature process required for high substitutional carbon concentration. According to one or more embodiments of the invention, both are achieved.

Another aspect of the invention pertains to methods for in situ phosphorus doping and selective epitaxial deposition of Si:C films: In general, in situ phosphorus doping during silicon deposition decreases growth rate and increases the etch rate of a crystalline film, therefore, it makes it difficult to achieve selectivity. In other words, it is difficult to achieve crystalline growth on crystalline surfaces of the substrate without any growth on dielectric surfaces. Also, in situ phosphorus doping tends to degrade crystallinity of epitaxial films.

According to one or more embodiments, the methods follow a sequential order, however, the process is not limited to the exact steps described herein. For example, other process steps can be inserted between steps as long as the order of process sequence is maintained. The individual steps of an epitaxial deposition will now be described according to one or more embodiments.

During experimentation, Cl$_2$ etchant gas was found to be very aggressive on n-type doped silicon at temperatures of about 600° C., which limited its capability to use on highly n-type doped substrates and on highly n-type doped silicon carbon films. According to embodiments of the invention, heavily P doped silicon carbon was deposited at low temperatures of less than about 600° C. During etching the temperature and pressure were ramped up and using >1 slm HCl flow to obtain reasonable etch rate and selectivity. An extremely high doping level of greater than $5 \times 10^{20}$ atoms/cm$^3$ P, with substitutional carbon level exceeding about 1.5% was achieved. Normally, such high levels of doping require ion implantation.

In one example, neo-pentasilane, silane, methylsilane and PH$_3$ were mixed and delivered to chamber, and non-selectively deposited on a substrate at 575° C. and 10 torr. During etching, the temperature was ramped up to 625° C. and pressure was ramped approximately 30 times the deposition pressure to 300 torr. HCl was flowed at 18 slm HCl during etching to etch the amorphous films deposited on dielectric surfaces. At least a 3:1 etch rate selectivity was achieved between amorphous films to epitaxial films. The procedure was repeated until a selective highly P doped silicon carbon with desired thickness of about 500-900 Angstroms was obtained on the open silicon area. Defect free silicon carbon epitaxy with >1.3% carbon, 95% substitutionality and a phosphorus doping level exceeding $3 \times 10^{20}$ atoms/cm$^3$ was obtained.

In another example, 50 sccm of disilane, 150 sccm of silane and 200 sccm of 5% methylsilane in Argon, 60 sccm of dichlorosilane (DCS) and 225 sccm of 1% PH$_3$ in H$_2$ were mixed and delivered to the chamber with 5 slm N$_2$ carrier gas during non-selective deposition. Non-selective deposition was performed on a substrate at a pressure of 10 torr for 11 seconds. During etching, the temperature was ramped up to 625° C. and the pressure was ramped to 300 torr. During etching, 18 slm HCl was used to etch the amorphous films deposited on dielectric surfaces. Defect free silicon carbon epitaxy was obtained after about 30 seconds of etching. With 20 cycles, a thickness of 550 Angstroms of selective silicon carbon containing about 1.4% carbon, with greater than about 90% substitutionality and greater than about $5.2 \times 10^{20}$ atoms/$cm^3$ P dopant was obtained on an unpatterned substrate. Repeating the same recipe on a patterned substrate resulted in a defect-free film having similar properties and a thickness 850 Angstroms.

Additional experimentation revealed that temperatures exceeding 600° C. and pressures exceeding about 10 times the deposition pressure or 100 torr is sufficient to effectively etch the amorphous material with HCl during etching. In prior work, disilane was not considered to be suitable for P doped silicon carbon application by due to the low process temperatures required. At such low temperatures, disilane was believed to be unable to provide a sufficient deposition rate. However, in our experiments, deposition rates exceeding about 600 Angstroms/min were achieved. The addition of dichlorosiliane or HCl during deposition was observed to help selectivity, as disclosed in U.S. patent application Ser. No. 11/227,874, published as United States Patent Application Publication No. US2006/0115933. In addition, it was observed that a high flow of disilane and additive of dichlorosilane/HCl might help the positive loading on patterned substrates, resulting in a thicker epitaxial layer on the crystalline portions of the substrate.

One or more embodiments of the present invention provide methods that are particularly useful in forming complementary metal oxide semiconductor (CMOS) integrated-circuit devices and will be described in that context. Other devices and applications are also within the scope of the invention. FIG. 1 illustrates portions of a cross sectional view of a FET pair in a typical CMOS device. Device 100 comprises a semiconductor substrate after forming wells to provide source/drain regions, gate dielectric, and gate electrode of an NMOS device and PMOS device. The device 100 can be formed using conventional semiconductor processes such as growing single crystal silicon and formation of shallow trench isolation structures by trench etching and growing or depositing dielectric in the trench openings. Detailed procedures for forming these various structures are known in the art and are not described further herein.

Device 100 comprises a semiconductor substrate 155, for example, a silicon substrate, doped with a p-type material, a p-type epitaxial silicon layer 165 on substrate 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. First isolation region 158 electrically isolates NMOS 110 and PMOS 140 transistors, and second isolation region 160 electrically isolates the pair of transistors 110 and 140 from other semiconductor devices on substrate 155.

According to one or more embodiments of the invention, NMOS transistor 110 comprises a gate electrode 122, first source region 114 and a drain region 116. The thickness of the NMOS gate electrode 122 is scalable and may be adjusted based on considerations related to device performance. NMOS gate electrode 122 has a work function corresponding to the work function of a N-type device. The source and drain regions are n-type regions on opposite sides of the gate electrode 122. Channel region 118 is interposed between source region 114 and drain region 116. A gate dielectric layer 112 separates channel region 118 and gate electrode 122. Processes for forming the NMOS gate electrode 122 and dielectric layer are known in the art and are not discussed further herein.

According to one or more embodiments, PMOS transistor 140 comprises a gate electrode 152, a source region 144 and a drain region 146. The thickness of the PMOS gate electrode 152 is scalable and may be adjusted based on considerations related to device performance. PMOS gate electrode 152 has a work function corresponding to the work function of a N-type device. The source and drain regions are p-type regions on opposite sides of gate electrode 152. Channel region 148 is interposed between source region 144 and drain region 146. A gate dielectric 142 separates channel region 148 and gate electrode 152. Dielectric 142 electrically insulates gate electrode 152 from channel region 148. It will be appreciated that the structures of the transistors 110 and 140 shown in FIG. 2 and described immediately above are exemplary only, and various variants in materials, layers, etc. are within the scope of the present invention.

Figure 2:
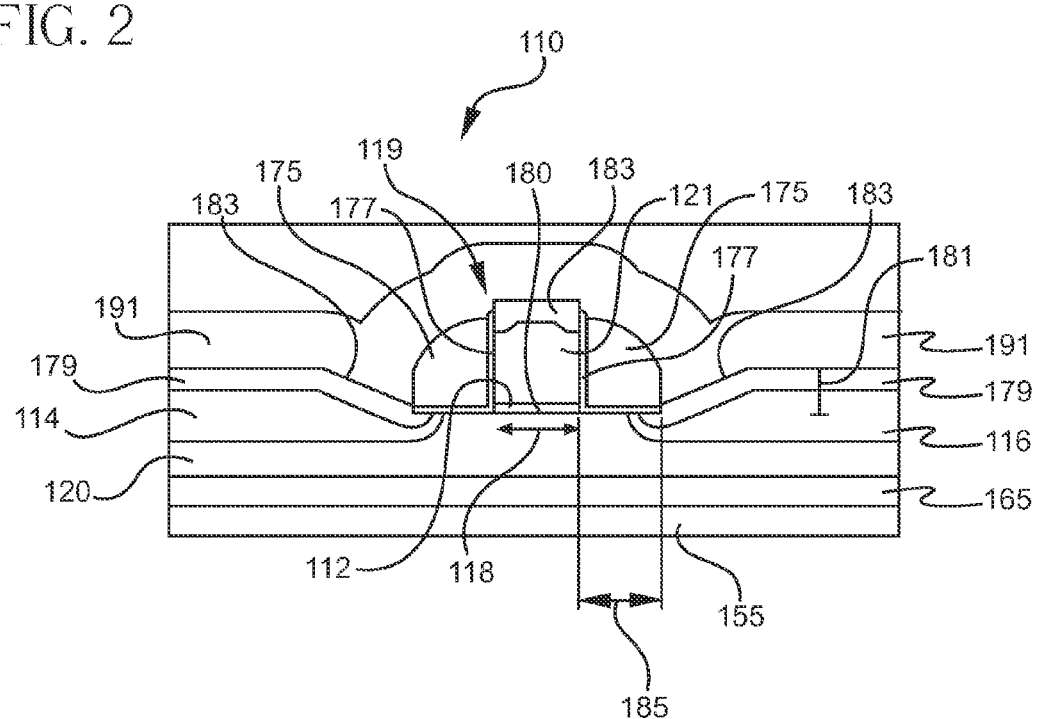
FIG. 2 is a cross-sectional view of the NMOS field effect transistor shown in FIG. 1 having additional layers formed on the device.

Referring now to FIG. 2, which shows a view of additional details of the NMOS device 110 of FIG. 5 after formation of spacers, layers over the source/drain regions, for example, silicide layers, and formation of the etch stop 191. It will be appreciated that the PMOS device shown in FIG. 6 may contain similar spacers and layers that may be tailored in dimensions and/or composition to affect the stress induced in the channel of the NMOS device as will be described further below. However, for illustration purposes, only NMOS device is shown and described in detail.

FIG. 2 shows spacers 175 that may be formed from suitable dielectric material incorporated around the gate 119 including gate electrode 121. Offset spacers 177 may also be provided, which surround each of the spacers 175. Processes for forming shapes, sizes, and thickness of spacers 175 and 177 are known in the art and are not further described herein. A metal silicide layer 179 may be formed over the source region 114 and drain region 116. The silicide layer 179 may be formed from a suitable metal such as nickel, titanium, or cobalt by any suitable process such as sputtering or PVD (Physical Vapor Deposition). The silicide layer 179 may diffuse into portions of the underlying surfaces. Elevation of the drain region 116 is shown by the arrow 181, which is shown as the distance from the substrate surface 180 to the top of the silicide layer 179. Facet 183 of source drain region is shown as the angled surface As will be understood by the skilled artisan, the exemplary device described above may be modified to include a source/drain or source/drain extension having a Si:C epitaxial layer that may be further modified according to the methods described herein.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method for epitaxially forming a silicon-carbon film on a monocrystalline surface on a substrate, comprising:
   placing the substrate including the monocrystalline surface and secondary surfaces into a process chamber;
   exposing the substrate to deposition gases comprising a silicon source, a carbon source and an n-type dopant at a deposition temperature of less than about 600° C. and at a deposition pressure; and
   exposing the substrate to an etching gas comprising hydrogen chloride at an etching temperature exceeding about 600° C. and below about 650° C. and at an etching pressure at least about 10 times the deposition pressure and exceeding about 100 Torr, the method resulting in selective deposition of the silicon-carbon film in the form of heavily doped n-type epitaxy on the monocrystalline surface.

2. The method of claim 1, wherein the dopant comprises one or more of phosphorus and arsenic sources.

3. The method of claim 2, wherein the phosphorus source comprises phosphine and the arsenic source comprises arsine.

4. The method of claim 2, wherein the etching gas comprises only hydrogen chloride.

5. The method of claim 4, wherein the hydrogen chloride is delivered to the process chamber from a hydrogen chloride source gas.

6. The method of claim 4, wherein the hydrogen chloride is formed in the process chamber upon mixing hydrogen and chlorine source gases in the chamber.

7. The method of claim 4, wherein the silicon source is selected from a mixture of monosilane and a higher order silane.

8. The method of claim 7, wherein the higher order silane is selected from disilane and neo-pentasilane.

9. The method of claim 2, wherein the dopant is present in the silicon-carbon film at a level of at least about $2\times10^{20}$ atoms/cm$^3$.

10. The method of claim 9, wherein the level is at least about $5\times10^{20}$ atoms/cm$^3$.

11. The method of claim 8, wherein the deposition temperature is in the range of about 575° C. and about 600° C.

12. The method of claim 1, wherein dichlorosilane is flowed during deposition.

13. The method of claim 1, wherein the carbon source comprises methylsilane.

14. The method of claim 1, wherein hydrogen chloride is additionally flowed during deposition.

15. The method of claim 1, wherein the silicon-carbon film is formed during a fabrication step of a transistor manufacturing process, and the method further comprises:
   forming a gate dielectric on the substrate;
   forming a gate electrode on the gate dielectric; and
   forming source/drain regions on the substrate on opposite sides of the gate electrode and defining a channel region between the source/drain regions.

16. The method of claim 11, wherein the silicon-carbon film is formed during a fabrication step of a transistor manufacturing process, and the method further comprises:
   forming a gate dielectric on the substrate;
   forming a gate electrode on the gate dielectric; and
   forming source/drain regions on the substrate on opposite sides of the gate electrode and defining a channel region between the source/drain regions.

17. The method of claim 1, wherein the etching pressure is at least about 30 times the deposition pressure.

18. The method of claim 1 wherein the silicon-carbon film has a carbon concentration of greater than 1%.

19. The method of claim 18 wherein the carbon concentration is greater than 1.5%.

* * * * *